Figure 1:
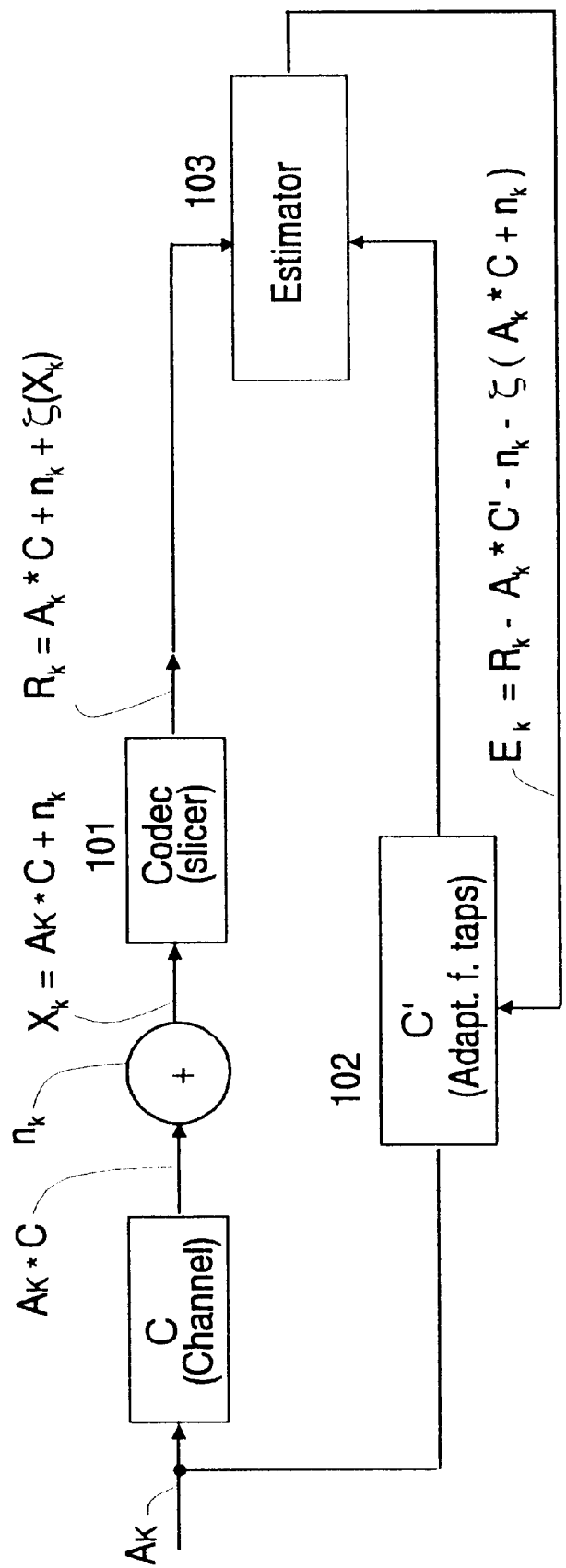

United States Patent
Dagdeviren

[19]

[11] Patent Number: 6,118,812
[45] Date of Patent: Sep. 12, 2000

[54] DIGITAL EQUALIZATION IN THE PRESENCE OF QUANTIZATION NOISE

[75] Inventor: Nuri Ruhi Dagdeviren, Red Bank, N.J.

[73] Assignee: Lucent Technologies Inc., Murray Hill, N.J.

[21] Appl. No.: 09/015,568

[22] Filed: Jan. 30, 1998

Related U.S. Application Data

[60] Provisional application No. 60/047,238, May 20, 1997.

[51] Int. Cl.[7] .................................................. H03H 7/30

[52] U.S. Cl. ........................ 375/229; 375/222; 375/230; 375/249; 379/410

[58] Field of Search ............................... 375/229, 222, 375/249, 230; 341/143; 348/614; 379/410

[56] References Cited

U.S. PATENT DOCUMENTS

| | | | |
|---|---|---|---|
| 4,071,842 | 1/1978 | Tewksbury | 341/143 |
| 4,385,393 | 5/1983 | Chaure et al. | 375/249 |
| 5,473,686 | 12/1995 | Virdee | 379/410 |
| 5,481,564 | 1/1996 | Kakuishi et al. | 375/230 |

*Primary Examiner*—Stephen Chin
*Assistant Examiner*—Shuwang Liu
*Attorney, Agent, or Firm*—Howard R. Popper

[57] ABSTRACT

A method is presented to enable the impulse response of a channel to be identified when the received signal contains a large amount of quantization noise. A probabilistic estimate of the distribution of the quantization noise is subtracted from the summation of the products of the received training signal samples and tap coefficients to provide a more accurate error signal for the adjustment of the tap coefficients.

1 Claim, 1 Drawing Sheet

DIGITAL EQUALIZATION IN THE PRESENCE OF QUANTIZATION NOISE

This invention claims the benefit of U.S. Provisional Application No. 60/047,238, filed May 20, 1997.

FIELD OF THE INVENTION

This invention relates to the analog transmission of digital information over telephone lines using modems and, more particularly to the transmission of such information over channels involving codecs which quantize the analog signals to accommodate digital switching and transmission.

BACKGROUND OF THE INVENTION

Digital transmission over a channel requires equalization of the channel's response over the frequency spectrum used by the transmitted information. A channel's impulse response is defined as the pulse resulting from the application of an impulse of unit value to the channel. When a channel is properly equalized, symbols preceding and following the symbol of interest contribute nothing to that signal, i.e., there is no inter-symbol interference at the moment when the signal of interest is sampled. Equalization is commonly performed by digital signal processing after the analog waveform received by the subscriber's modem has been quantized by a high precision analog to digital (A/D) converter in the modem at a sufficiently high sampling rate to avoid aliasing distortion. A popular method of equalization is accomplished by passing the digital signal through an adaptive filter and updating each filter tap coefficient in a direction opposite to the derivative of the mean square error signal for that tap. This method is also referred to as the least mean squared (LMS) method of adaptation.

When the receiving modem is digitally connected to the network, the function of the A/D converter in the modem is replaced by a limited precision A/D converter at the network subscriber line interface and the digital signal presented to the adaptive filter includes whatever error was introduced because of the difference between the network codec's limited set of discrete slicing levels and the actual amplitude of the received analog signal. The amplitude difference to the nearest quantization level is called the quantization error. This error in $\mu$-law and A-law codecs is different for each amplitude of transmitted signal. As a result, the response that needs to be equalized includes the quantization error characteristics of the network A/D converter, as well as that of the physical channel, e.g., the subscriber loop. While the subscriber loop can be reasonably well modeled with a linear response over the voice band, important non-linear impairments are present in the A/D and D/A converters. It has been observed that PCM A-law or $\mu$-law encoding introduces about 37–38 dB of quantization noise. This quantization noise sets an upper limit to the transmission speeds obtainable using traditional modem modulation techniques, such as CCITT V.34.

In U.S. Pat. No. 5,394,437, assigned to the assignee of the present application, a high speed modem is described which is synchronized to the sampling times of the PCM codec and which also transmits analog signals at the same discrete amplitude levels as are employed by the codec. Recently, there has been substantial interest in the "56k" modems developed using the techniques in this patent Early products have only achieved higher speed operation in the server modem to client modem direction. This is no surprise as the practical challenges of achieving high speed operation in the reverse direction are greater as the contents of this application will illustrate. The procedures of U.S. Pat. No. 5,394,437 minimize or eliminate the effects of quantization noise once the system has been "trained" and, for this, the impulse response of the channel in the direction from the customer's modem to the network codec must first have been accurately identified. This is accomplished during a training interval. But during the training interval the PCM codec introduces quantization noise, so at first glance it appears that the channel impulse response cannot be ascertained to an accuracy better than the 38 dB signal to noise ratio introduced by the codec. Since the achievement of data rates greater than what are available with current generation of V.34 or "56k" modems in the client-to-server direction require a signal to nose ratio better than 38 dB it would be of great utility to provide a method for more accurately ascertaining the impulse response of a channel and then equalizing the channel despite the presence of codec quantization noise.

SUMMARY OF THE INVENTION

In accordance with the principles of the present invention, use is made of the fact that quantization noise is not truly random and therefore lends itself to a deterministic biasing of the convergence when a stochastic algorithm, such as a least mean squares averaging, is used to average the effects of noise on the convergence. More particularly, an estimate of the probabilistic distribution of the quantization noise in a sampled training sequence is obtained. This estimate is used along with the error signal obtained between (a) the received signals and (b) the convolution of the training sequence and the coefficients of a transversal filter through which the samples are passed. The error signal, as biased by the probabilistic distribution of the quantization noise, is used to adjust the tap coefficients of the transversal filter.

GENERAL DESCRIPTION

Referring now to FIG. 1, there is shown, at the left, a signal source applying a training sequence of discrete time sequence signals $A_k$ to a channel C subjected to random noise $n_k$. At the receiver, the signals $X_k$ are applied to a codec (slicer) 101 which quantizes the signal into Mu-law or A-law pulse-coded modulation (PCM) at a nominal rate of 8000 samples per second. The subscript k corresponds to the discrete time index enumerating successive samples in time. The input $X_k$ to the codec is $A_k * C + n_k$. By the symbol *, we denote the convolution of the sequence $A_k$ with the channel response C. Slicer 101 introduces quantization noise so that the signal values, $R_k$, at the output of slicer 101 include the effects of quantization noise which is a function of the signal amplitude, i.e., $\zeta(X_k)$, and therefore the received samples $R_k$, may be represented by:

$$R_k = A_k * C + n + \zeta(A_k * C + n_k) \tag{1}$$

where $\zeta$ is the quantization noise function, a function which varies as the difference between the amplitude of the received signal, X, and the nearest quantizing level $L_m$, i.e., $$\zeta(X) = L_m - X.$$

The received samples $R_k$, are applied to adaptive filter 102 via estimator 103. In the prior art the objective has been to update the adaptive filter taps C', based on the known training sequence $A_k$ that was transmitted and the received values $R_k$. An error signal, $$E_k = R_k - A_k * C', \quad (2)$$

was defined and each variable tap coefficient $C'_k$ of filter 102 corresponding to time k was adjusted to minimize the time average of $E_k$ by moving each tap coefficient in the opposite direction to the derivative of $(E_k)^2$ with respect to that variable:

$$C'_{k+1} = C'_k + \beta E_k A_k \quad (3)$$

In equation (3) $\beta$ is the update step size which must carefully be chosen to optimize the convergence of the algorithm. Unfortunately, equation (2) neglects the fact of quantization noise in the received signal.

If, however, it is attempted to modify the error definition of equation (2) to reflect the presence of quantization noise, it becomes:

$$E_k = R_k - A_k * C' - n_k - \zeta(A_k * C + n_k) \quad (4)$$

However, the receiver sees only the quantized level $L_m$ and therefore has no information from which to calculate $\zeta(A_k * C + n_k)$, as required by the more accurate expression of error defined by equation (4).

In accordance with an important aspect of the present invention it is proposed to employ an estimator box 103 which will use an estimate of an ensemble average of $\zeta(A_k * C + n_k)$. The process will then converge to the values of the correct channel taps C with a degree of precision higher than the ratio of the variance of the noise $\zeta$ to the signal R. The variance of $\zeta$ is a measure of the dispersion of its distribution. The value of the variance of $\zeta$ is the integral, over all possible values of $\zeta$, of the product of its value, or some given function of it, with the probability of that value:

$$E[f(\zeta)] = \int_a^b p(\zeta) f(\zeta) d\zeta, \quad (5)$$

where [a, b] is the range of the values of the variable, and p(x) is its probability function. The convergence may be optimized by using a more accurate estimate of the ensemble average of $\zeta$, as follows:

$$<\zeta(A_k * C + n_k)> = \int \rho(A_k * C + n_k) \zeta(A_k * C + n) d(A_k * C + n_k), \quad (6)$$

Substituting x for $(A_k * C)$ above yields:

$$<\zeta(A_k * C + n_k)> = \int \rho(x + n_k) \zeta(x + n) d(x + n_k), \quad (6a)$$

Assuming that the $A_k$ are independent and identically distributed, $x = (A_k * C)$ will have an approximately gaussian distribution according to the central limit theorem. (See, with respect to the central limit theorem, L. Kleinrock, "Queing Systems", vol. 1. Appendix II.) Accordingly, $\rho(x) \approx \exp[-(x \backslash x_0)^2]$. In addition, since the received signal is quantized to the value $R_k$, we know that it fell within the threshold values just above and below R, so that $\rho$ is zero outside this range.

$$\langle \zeta(A_k * C + n_k) \rangle = N \int \exp[-(x/x_0)^2] \zeta(x+n) dx \quad (7)$$

$$= N \int_R \exp[-(x/x_0)^2](R_k - x - n) dx$$

where L is the nearest quantization level of the codec to x+n and N is a normalization factor which will be determined below. The integration is carried out over the range R which would be quantized to L. Ignoring the nonlinear behavior of the ensemble average with respect to n in the above our approximations will only be accurate to the order of accuracy of the ratio of n to $A_k * C$.

Furthermore, we set the ensemble average of this noise from unknown sources to zero so that:

$$\langle \zeta(A_k * C + n_k) \rangle = N \int_R \exp[-(x/x_0)^2](L - x) dx \quad (8)$$

$$= \frac{L - (x_0/\pi)(\exp(-(L-\Delta)^2/x_0^2) - \exp(-(L+\Delta)^2/x_0^2))}{\text{erf}[(L+\Delta)/x_0] - \text{erf}[(L-\Delta)/x_0]} \quad (8a)$$

Here, erf is the error function, erf(y):

$$\text{erf}(y) = \int_{-\infty}^y e^{-x^2} dx,$$

$L+/-\Delta$ represents the upper/lower end of the quantization region that corresponds to L which can be replaced with arbitrary thresholds not necessarily with midpoint at L. We find the scale $x_0$ using the normalization condition:

$$\langle x^2 \rangle = \frac{\int x^2 \exp[-(x/x_0)^2] dx}{\int \exp[-(x/x_0)^2] dx} = E \quad (9)$$

where E is the average signal energy. This yields the final result:

$$\langle \zeta(A_k * C) \rangle = \quad (10)$$

$$\frac{L - ((2E)^{1/2}/\pi)[\exp(-(L-\Delta)^2/(2E) - \exp(-(L+\Delta)^2/2E)]}{\text{erf}[(L-\Delta)/(2E)^{1/2}] - \text{erf}[(L+\Delta)/(2E)^{1/2}]}$$

Using result of equation (10) or various approximations of it in equation (4) it is possible to bias the convergence of stochastic adaptation methods such as the least mean square (LMS) algorithm to speed up convergence substantially. What has been described is deemed to be illustrative of the principles of the invention. Numerous modifications may be made by those skilled in the art without, however, departing from the spirit and scope of the invention.

What is claimed is:

1. A method for adapting a PCM modem receiving signals over a channel to the channel's impulse response after transmitted signals have been converted to digital signals by quantization of their amplitudes into a predetermined set of coding levels, comprising:

processing the transmitted signals through an adaptive filter in said PCM modem;

estimating an ensemble average of noise introduced by quantizing said transmitted signals received over said channel at said predetermined levels; and adjusting the step size between successive adjustments of the coefficients of said adaptive filter during a training sequence in accordance with the time average error between (a) the received sequence and (b) the convolution of the transmitted signals of said training sequence and said adaptive filter coefficients, as modified by said estimating of said quantization noise.

* * * * *